(12) United States Patent
Kuznetsov et al.

(10) Patent No.: US 7,635,614 B1
(45) Date of Patent: Dec. 22, 2009

(54) DOUBLE GATE NLDMOS SCR DEVICE WITH CONTROLLABLE SWITCHING CHARACTERISTICS

(75) Inventors: Vladimir Kuznetsov, San Jose, CA (US); Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 233 days.

(21) Appl. No.: 11/724,622

(22) Filed: Mar. 15, 2007

(51) Int. Cl.
*H01L 21/323* (2006.01)
*H01L 29/74* (2006.01)

(52) U.S. Cl. ........................ 438/134; 257/119
(58) Field of Classification Search ................. 257/122, 257/141, 173, 360; 438/134, 141
See application file for complete search history.

(56) References Cited

U.S. PATENT DOCUMENTS

| | | | |
|---|---|---|---|
| 6,720,624 B1 * | 4/2004 | Vashchenko et al. | ......... 257/360 |
| 6,911,679 B1 * | 6/2005 | Vashchenko et al. | ......... 257/122 |

* cited by examiner

*Primary Examiner*—Calvin Lee
(74) *Attorney, Agent, or Firm*—Jurgen K. Vollrath

(57) ABSTRACT

An NLDMOS SCR device based on an LDMOS fabrication process includes a dual gate to provide controllable switching characteristics to allow it to be used for ESD protection of fast switching voltage regulators.

5 Claims, 3 Drawing Sheets

DOUBLE GATE NLDMOS SCR DEVICE WITH CONTROLLABLE SWITCHING CHARACTERISTICS

FIELD OF THE INVENTION

The invention relates to an ESD protection device for fast switching applications. In particular, it relates to an ESD protection device for fast switching voltage regulators that is compliant with LDMOS fabrication process.

BACKGROUND OF THE INVENTION

ESD protection devices typically operate either in normal mode, wherein a control gate is controlled by a bias voltage to define an active clamp, or operate in snapback mode based on punch-through effect, which occurs when the forward blocking voltage is reached.

In the latter case, the forward blocking voltage depends on the transient biasing dynamics, and can therefore lead to early triggering. Thus, while snapback ESD protection devices are designed to be triggered by an ESD pulse at a voltage magnitude in the ESD protection window, these devices can in fact be inadvertently turned on during normal operation when used in high voltage, fast switching applications. Thus this becomes an issue when dealing with ESD protection of fast switching devices such as fast switching voltage regulators, which during normal operation display switching times in the range of 10 ns-200 ps. Thus they can have switching times that are faster than the ESD rise time (10 ns for HBM pulse).

While NLDMOS SCR devices are highly suited for high voltage node ESD protection, they rely on passive switching due to a triggering voltage that exceeds the forward blocking voltage.

SUMMARY OF THE INVENTION

The present invention provides an ESD protection device for fast switching voltage regulators that is compliant with an LDMOS device fabrication process.

According to the invention, the ESD protection device includes a double gate, wherein one of the gates is controllable to change the triggering voltage of the device. In particular, the device may comprise an LDMOS, which includes an n+ drain formed in an n-well, an n+ source formed in a p-well, and a poly gate, the device further comprising a second or auxiliary poly gate formed over the n-well. The p-well and n-well may be formed in an n-epi layer or n-substrate. The auxiliary gate may be controlled by a control circuit, which controls the auxiliary gate bias voltage to vary the bias voltage depending on whether Vdd is applied to the device or not. Thus the control circuit serves to control the magnitude and polarity of the bias voltage to adjust the forward blocking voltage of the device to fall within the ESD protection window as defined by the dynamics of the ESD event prior to application of Vdd to the device, while accommodating the transient phenomena during normal operation of the switching voltage regulator once Vdd is applied.

DETAILED DESCRIPTION OF THE INVENTION

Figure 1:
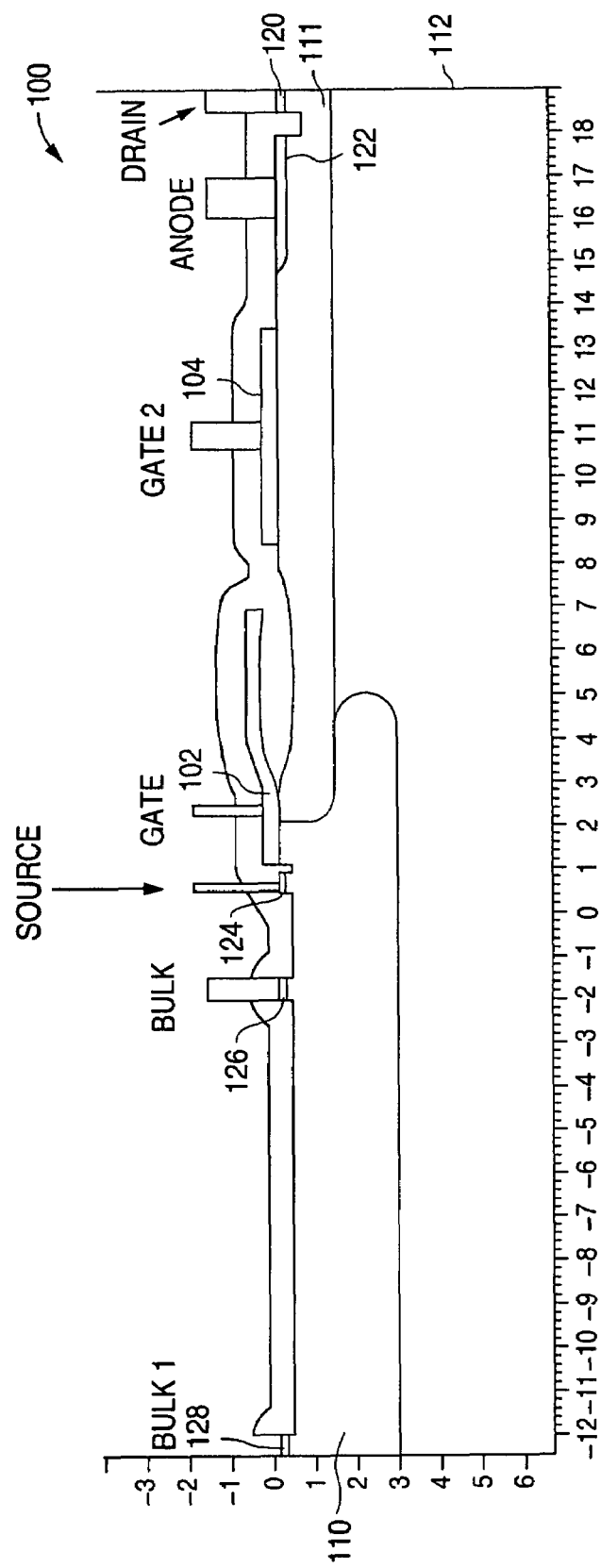
FIG. 1 is a sectional view through one embodiment of an ESD protection structure of the invention.

One embodiment of the invention is shown in FIG. 1, which shows a cross-section of an ESD structure in accordance with the invention. The structure 100 is based on and is fully compliant with an LDMOS device fabrication process. What distinguishes it over a conventional LDMOS device as known in the art is that it includes a dual gate. In particular, in addition to the poly gate 102, it includes a second, additional, or auxiliary poly gate 104 on the drain 106 side of the device.

As can be seen in FIG. 1, the device 100 includes a p-well 110 and an n-well 111 in a lightly doped n-epi layer 112. The drain is defined by an n+ region 120 formed in the n-well 111 adjacent to an anode defined by a p+ region 122. In the p-well 110, an n+ source region 124 and bulk contact regions 126, 128 are formed. Thus, like a standard LDMOS as known in the art, the present LDMOS 100 includes an n+ drain formed in an n-well, an n+ source formed in a p-well, and a poly gate. What distinguishes the present device over the standard LDMOS is the addition of the second or auxiliary poly gate 104 over the n-well 111

When a negative voltage is applied to the auxiliary gate 104, the surface depletion layer is extended in the drain region under the gate 104, which causes the resistance of the drain to go up. This will become clearer with reference to the equivalent circuit diagram of FIG. 3 in which the resistance 310 is increased. The effect of providing a negative bias voltage to the auxiliary poly gate 104 is to reduce the triggering voltage of the device. This can be explained by considering that the effect of extending the depletion region is that the lifetime of the holes passing through the electron-depleted region is extended. This causes the common emitter gain (which depends on the minority carrier lifetime) to increase, and in turn causes the forward blocking voltage to decrease, which decreases the triggering voltage. Seen another way, the increased drain resistance due to increase of the depletion region under the auxiliary gate, reduces the triggering current.

When the magnitude of the negative voltage applied to the gate 104 is reduced (less negative gate bias) or a the gate 104 is positively biased, the forward blocking voltage increases.

Figure 2:
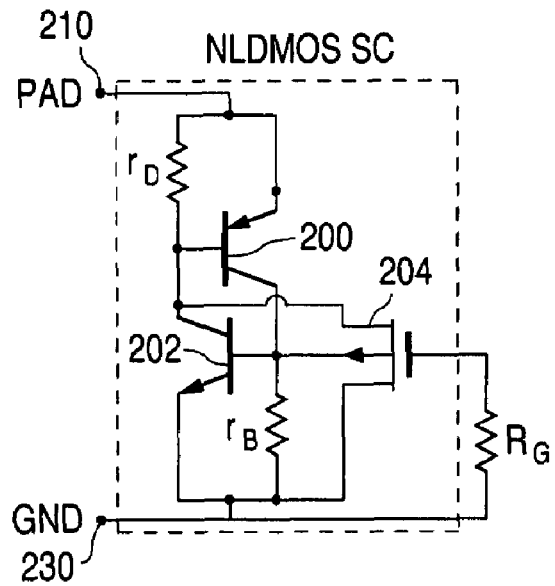
FIG. 2 shows an equivalent circuit diagram of a prior art NLDMOS SCR.
Figure 3:
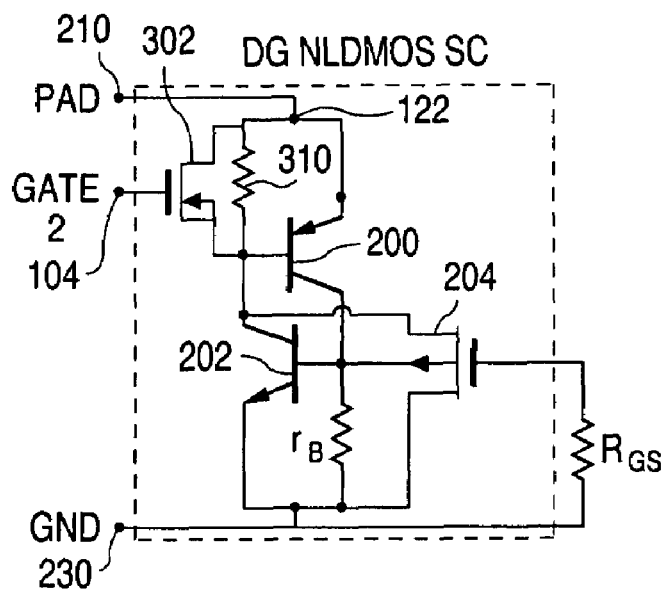
FIG. 3 shows an equivalent circuit diagram of the structure of FIG. 1.

The equivalent circuit diagram shown in FIG. 3 for the structure of FIG. 1 is best understood by way of comparison to an equivalent circuit diagram of a conventional NLDMOS SCR as shown in FIG. 2. As shown in FIG. 2, an NLDMOS SCR can be depicted as comprising a pnp transistor, an npn transistor 202, and an NMOS transistor 204. The emitter of the pnp 200 is connected to the pad 210, and its collector, which is defined by the same region as the base of the npn, is shown as connected to the base of the npn transistor 202. The emitter of the npn transistor 202, is in turn connected to ground 230.

The equivalent circuit of FIG. 3 is similar to that of FIG. 2 and therefore the same reference numerals are used to depict similar elements. Again the device defines a pnp transistor, in which the emitter is formed by the p+ region 122 (which defines the anode and is connected to the pad), the base is formed by the n-well 111, and the collector is formed from the p-well 110. The device also defines an npn transistor in which the collector is formed by the n-well 111, the base is formed by the p-well 110, and the emitter is formed by the n+ region 124 of the source. However, the device of the present invention further includes the second or auxiliary gate 104, which controls the drain resistance and is depicted in the equivalent circuit of FIG. 3 by a transistor 302, which controls the effective resistance of the resistor 310.

Figure 4:
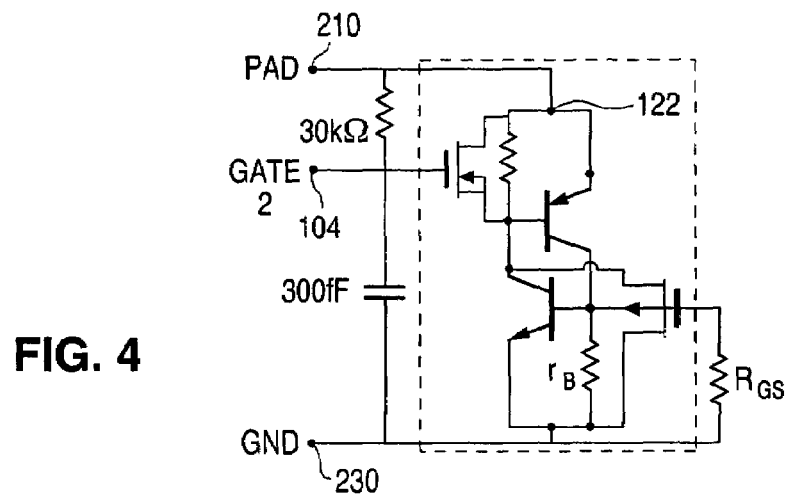
FIG. 4 shows an equivalent circuit diagram of the structure of FIG. 1 with a control circuit equivalent in the absence of Vdd.

In order to control the voltage on the auxiliary gate 104, a control circuit is used to control the bias voltage to the auxiliary gate 104. The effect of the control circuit (one embodiment of which is describe in commonly owned patent application entitled "ESD Protection Circuit with a Low Snapback Voltage that is protected from Fast Non-ESD Voltage Spikes and Ripples" filed on the same day as the present application and which is included herein by reference) essentially places an RC circuit across the control gate 102 as shown in FIG. 4 when no Vdd is applied. This protects the circuit under an ESD event by biasing the auxiliary gate 104 with respect to the pad. In contrast, the control circuit is operates as the equivalent circuit shown in FIG. 5 when Vdd is applied, which essentially shorts the auxiliary gate 104 to the pad as indicated by the 0.3Ω resistor. Thus, under normal operation (Vdd applied and no ESD pulse) the auxiliary gate bias voltage is high which increases the triggering voltage to avoid inadvertent triggering of the device. When Vdd is not applied, the auxiliary gate bias is lower, causing triggering voltage to be lower and ensuring that the device is protected during ESD events.

The device of the invention can therefore be used in conjunction with a control circuit to provide an active ESD clamp that is capable of triggering during an ESD event without interfering with the normal fast switching voltage regulator operation.

Figure 5:
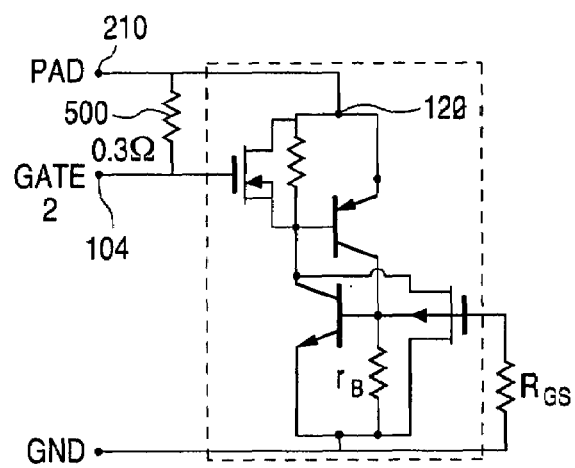
FIG. 5 shows an equivalent circuit diagram of the structure of FIG. 1 with a control circuit equivalent under normal operating conditions when Vdd is applied.
Figure 6:
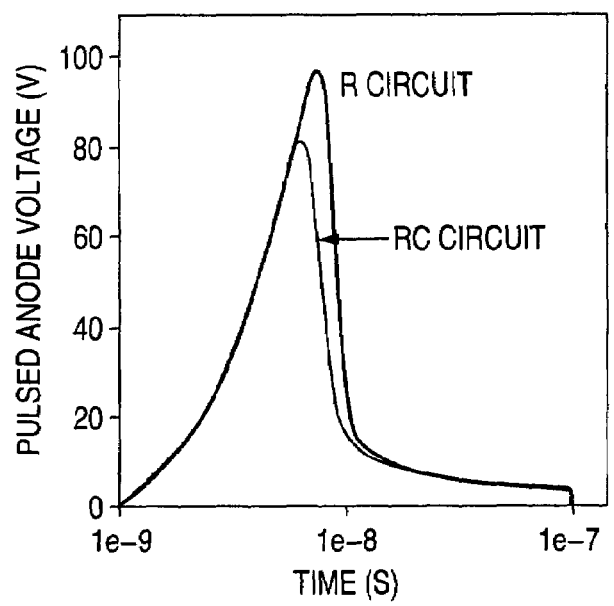
FIG. 6 shows pulsed anode voltage vs. time curves for the equivalent circuits of FIGS. 4 and 5.

As shown in the voltage versus time curves of FIG. 6, under normal operation when Vdd is applied and there is no ESD event (curve 600) and the control circuit is effectively reduced to an R circuit as shown in FIG. 5, the forward blocking voltage is substantially higher than during an ESD event (curve 602) when the RC circuit pulls the auxiliary gate low (as shown in FIG. 5).

While the invention has been described with reference to a particular embodiment, it will be appreciated that different embodiments can be provided without departing from the scope of the invention as defined by the claims.

What is claimed is:

1. A method of controlling the triggering voltage of an LDMOS device which includes an n+ drain formed in an n-well, an n+ source formed in a p-well, and a poly gate, the method comprising forming an auxiliary poly gate over the n-well and controlling a bias voltage to the auxiliary gate.

2. A method of claim 1, wherein the auxiliary gate bias voltage is controlled by a control circuit that varies the bias voltage depending on whether Vdd is applied to the LDMOS device or not.

3. A method of claim 2, wherein the bias voltage is reduced when no Vdd is applied to the LDMOS device, and is increased when Vdd is applied.

4. An LDMOS device, which includes an n+ drain formed in an n-well, an n+ source formed in a p-well, and a poly gate, the device further comprising
a second or auxiliary poly gate formed over the n-well.

5. An LDMOS device of claim 4, wherein the p-well and n-well are formed in an n-epi layer or an n-substrate.

* * * * *